United States Patent
Moyerman et al.

(10) Patent No.: US 9,425,377 B2
(45) Date of Patent: Aug. 23, 2016

(54) TUNNEL JUNCTION FABRICATION

(71) Applicant: The Regents of the University of California, Oakland, CA (US)

(72) Inventors: Stephanie Moyerman, La Jolla, CA (US); Brian Keating, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 50 days.

(21) Appl. No.: 14/257,898

(22) Filed: Apr. 21, 2014

(65) Prior Publication Data

US 2014/0315723 A1    Oct. 23, 2014

Related U.S. Application Data

(60) Provisional application No. 61/814,029, filed on Apr. 19, 2013.

(51) Int. Cl.
| | |
|---|---|
| *H01L 21/00* | (2006.01) |
| *H01L 39/22* | (2006.01) |
| *H01L 39/24* | (2006.01) |
| *G06N 99/00* | (2010.01) |
| *G01K 7/01* | (2006.01) |

(52) U.S. Cl.
CPC ............ *H01L 39/2493* (2013.01); *G01K 7/01* (2013.01); *G06N 99/002* (2013.01); *H01L 39/22* (2013.01); *H01L 39/223* (2013.01); *H01L 39/228* (2013.01)

(58) Field of Classification Search
CPC ............ H01L 39/2493; H01L 39/2496; H01L 39/223; G01K 7/01
USPC ................ 438/2, 681; 505/329, 160, 170
See application file for complete search history.

(56) References Cited

U.S. PATENT DOCUMENTS

| | | | | |
|---|---|---|---|---|
| 4,421,785 | A * | 12/1983 | Kroger | H01L 39/2493 148/DIG. 89 |
| 5,298,112 | A * | 3/1994 | Hayasaka | H01L 21/02071 216/48 |
| 5,634,718 | A * | 6/1997 | Martinis | G01K 7/006 374/142 |
| 5,710,437 | A * | 1/1998 | Kurakado | H01L 39/2493 250/336.2 |
| 5,801,984 | A * | 9/1998 | Parkin | H01L 43/08 257/E43.004 |
| 6,581,387 | B1 * | 6/2003 | Ullom | F25B 21/00 136/203 |
| 2003/0133339 | A1 * | 7/2003 | Estes | B82Y 10/00 365/200 |
| 2007/0077664 | A1 * | 4/2007 | Chung | G01K 7/36 438/2 |

(Continued)

FOREIGN PATENT DOCUMENTS

ES    2480989    *   5/2012    ......... G01K 7/006

OTHER PUBLICATIONS

Yaoi et al , "Dependendence of Magnetoresistance on temperature and applied voltage in a Ni—Fe/Al—Al2O3/Co tunneling junction", Journal of Magnetism and Magnetic Materials , vol. 126 (1993) pp. 430-432.*

(Continued)

*Primary Examiner* — Caridad Everhart
(74) *Attorney, Agent, or Firm* — Fish & Richardson P.C.

(57) ABSTRACT

A method for fabricating a tunnel junction includes depositing a first electrode on a substrate, depositing a wetting layer having a thickness of less than 2 nm on the first electrode, using atomic layer deposition (ALD) to deposit an oxide layer on the wetting layer, and depositing a second electrode on the oxide layer. The wetting layer and the oxide layer form a tunnel barrier, and the second electrode includes a superconductor.

13 Claims, 7 Drawing Sheets

(56) References Cited

U.S. PATENT DOCUMENTS

| | | | | |
|---|---|---|---|---|
| 2012/0251845 A1* | 10/2012 | Wang | ............... | G11B 5/66 428/827 |
| 2013/0017323 A1* | 1/2013 | Garces | ............... | C23C 16/02 427/126.4 |
| 2013/0119351 A1* | 5/2013 | Shea | ............... | H01L 39/223 257/31 |
| 2015/0119252 A1* | 4/2015 | Ladizinsky | ............ | B82Y 10/00 505/170 |

OTHER PUBLICATIONS

Adrian Cho, "A thermometer beyond compare?", Science, vol. 299, No. 5613, (Mar. 14, 2003) p. 1641.*

Matthias Meschke et al, "Single mode heat conduction by photons" Nature, vol. 444 (Nov. 2006) pp. 187-190.*

Yaoi et al. "Dependendence of Magnetoresistance on temperature and applied voltage in a Ni—Fe/Al—Al2O3/Co tunneling junction", Journal of Magnetism and Magnetic Materials, vol. 126 (1993) pp. 430-432.*

Abstract of ES2380989A1, Maldonade et al (May 2012), 2 pages.*

Broom et al., "Josephson junctions of small area formed on the edges of niobium films", Applied Physics Letters 37(2), Jul. 1980, pp. 237-239.

Chang et al., "Hydrous-Plasma Treatment of Pt Electrondes for Atomic Layer Deposition of Ultrathin High-κ Oxide Films", Electrochemical and Solid-State Letters, 10 (3) G5-G7 (2007).

Clark et al., "Practical electron-tunneling refrigerator", Applied Physics Letters, vol. 84, No. 4, Jan. 2004, pp. 625-627.

Clark et al., "Cooling of bulk material by electron-tunneling refrigerators", Applied Physics Letters 86, 173508 (2005), 3 pages.

Elliot et al., "Probing the Nucleation of $Al_2O_3$ in Atomic layer Deposition on Aluminum for Ultrathin Tunneling Barriers n. Josephson Junctions", IEEE Transactions on Applied Superconductivity, vol. 23, No. 3, 1101405, Jun. 2013, 5 pages.

Steven M. George, "Atomic Layer Deposition: An Overview", Chem. Rev. 2010, 110, 111-131.

Groner et al., "Electrical characterization of thin $Al_2O_3$ films grown by atomic layer deposition on silicon and various metal substrates", Thin Solid Films 413 (2002 186-197.

Gurvitch et al., "High quality refractory Josephson tunnel junctions utilizing thin aluminum layers", Applied Physics Letters 42 (5), Mar. 1983, pp. 472-474.

Javey et al., "High-κ dielectrics for advanced carbon-nanotube transistors and logic gates", Nature Materials, vol. 1, Dec. 2002, pp. 241-246.

Leskelä et al., "Atomic layer deposition (ALD): from precursors to thin film structures", Thin Solid Films 409 (2002) 138-146.

Lowell et al., "Macroscale refrigeration by nanoscale electron transport", Applied Physics Letters 102, 082601 (2013), 4 pages.

Ku et al., "Decoherence of a Josephson qubit due to coupling to two-level systems", Physical Review B 72, 024526 (2005), 10 pages.

Martinis, et al., "Decoherence in Josephson Qubits for Dielectric Loss", Physical Review Letters, PRL 95, 210503, Nov. 2005, 4 pages.

Miller et al., "Measurements and Modeling of Phonon Cooling by Electron-Tunneling Refrigerators", IEEE Transactions on Applied Superconductivity, vol. 15, No. 2, Jun. 2005, pp. 556-559.

Miller et al., "High resolution x-ray transition-edge sensor cooled by tunnel junction refrigerators", Applied Physics Letters 92, 163501 (2008), 4 pages.

Simmonds et al., "Decoherence in Josephson Phase Qubits from Junction Resonators", Physical Review Letters, vol. 93, No. 7, 077003, Aug. 2004, 4 pages.

Wendin et al., "Quantum bits with Josephson junctions", Low Temperature Physics, vol. 33, No. 9, Sep. 2007, pp. 724-744.

* cited by examiner

TUNNEL JUNCTION FABRICATION

CROSS-REFERENCE TO RELATED APPLICATION

This application claimed priority to U.S. application Ser. No. 61/814,029 filed on Apr. 19, 2013, which is incorporated herein by reference.

BACKGROUND

This specification relates to tunnel junction fabrication, for example, superconducting junction fabrication. In recent years, superconducting tunnel junctions have become a viable technology for a wide range of cryogenic applications. There is intense interest in solid-state quantum computing based on a range of systems that include superconducting-insulating-superconducting (SIS) trilayers as the building blocks for quantum bits (qubits) in quantum computers. Normal-insulating-superconducting (NIS) junctions have been used as on-chip solid-state refrigerators and more recently as bulk cryogenic coolers.

Both SIS and NIS technologies utilize pristine dielectric barriers a few nanometers thick to serve as tunnel junctions. These barriers are typically fabricated via thermal oxidation of Al or Al alloys using a controlled combination of temperature, partial pressure of oxygen, and time. However, the diffusive nature of the thermal oxidation process leads to point defects in the tunnel barrier that affect junction quality. Currently, barriers for tunnel junctions are created using diffuse oxidation processes that can limit device performance.

SUMMARY

This specification describes technologies relating to tunnel junction fabrication, for example, superconducting junction fabrication. Processes for fabricating high quality tunnel barriers in normal-insulating-superconducting (NIS) or superconducting-insulating-superconducting (SIS) tunnel junctions are described. A tunnel junction is a barrier, such as a thin insulating layer or electric potential, between two electrically conducting materials.

In superconducting tunnel junctions, two superconducting electrodes are separated by a non-superconducting barrier. Cooper pairs carry a supercurrent through the barrier by quantum tunneling, a phenomenon known as the Josephson effect.

The tunnel junction barriers are deposited as a single atomic monolayer one at a time using Atomic Layer Deposition (ALD). For example, ALD can deposit single atomic monolayers of $Al_2O_3$ on a sample surface. When a voltage is applied to a completed tunnel junction device, quantum tunneling moves the hottest electrons from one side of the tunnel junction barrier through the barrier into the other side of the tunnel junction, allowing the device to be used as a self-calibrated thermometer and potentially as a cryogenic refrigerator. The disclosed technologies can be used for tunnel junction cryogenic refrigerators, cryogenic thermometers, and superconducting quantum computer bits.

The disclosed methods and apparatus enables fabrication of high quality, large area tunnel junction barriers for NIS or SIS tunnel junctions. For example, ALD and an aluminum wetting layer allow the formation of a nanometer scale insulating barrier on gold films. Electronic transport measurements confirm that single-particle electron tunneling is the dominant transport mechanism, and measured current-voltage curves demonstrate the viability of using these devices as self-calibrated, low temperature thermometers with a wide range of tunable parameters. The disclosed methods and apparatus enable superconducting technologies that involve deposited tunnel junction barriers and allows fabrication of high performance junction refrigerators.

Particular embodiments of the subject matter described in this specification can be implemented to realize one or more of the following advantages. Superconducting tunnel junction fabrication can be improved so as to eliminate, or at least significantly reduce, point defects in tunnel barriers that are fabricated using traditional approaches. These traditional defects can result in decoherence in SIS junctions that limit the performance of qubits and subgap leakage in NIS junctions that limits their cooling power. Point defects can also place an upper limit on the size and yield of superconducting tunnel junctions. For a fixed specific resistance (i.e., resistivity), the cooling power of an NIS junction refrigerator scales directly with junction area, thus the ability to fabricate larger junctions can vastly improve refrigeration capabilities.

Epitaxial deposition using ALD can rid the barrier of defects that prevent commercial viability. Further, ALD allows barrier thickness to be precisely tuned down to 0.02 nm, allowing for further improvements in device properties. Utilizing ALD, high quality tunnel barriers can now be deposited on materials that are non-oxidizing (i.e., do not natively oxidize), such as Au, or metals that form incomplete or conductive oxide layers, such as Cu and Ag.

Electronic transport measurements confirm that single-particle electron tunneling is the dominant transport mechanism, and measured current-voltage curves demonstrate the viability of using these devices as self-calibrated, low temperature thermometers with a wide range of tunable parameters. This description discloses and demonstrates large area superconducting tunnel junctions fabricated using atomic layer deposition that include a high quality insulating tunnel barrier. The insulating layer has been deposited on Au, showing the viability of using non-oxidizing metals as the electrodes in the future fabrication of NIS refrigerators and SIS qubits.

The details of one or more embodiments of the subject matter described in this specification are set forth in the accompanying drawings and the description below. Other features, aspects, and advantages of the invention will become apparent from the description, the drawings, and the claims.

DETAILED DESCRIPTION

Figure 1A:
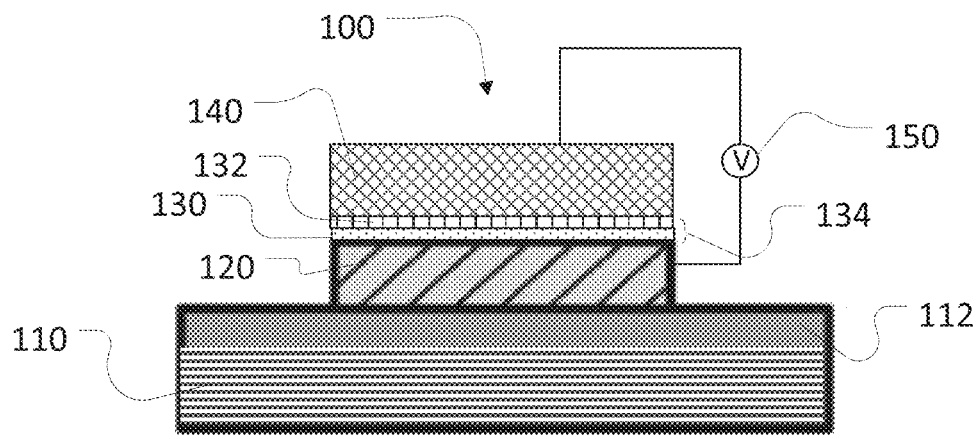
FIG. 1A shows a schematic of a tunnel junction.

FIG. 1A shows a schematic of a normal-insulating-superconducting (NIS) junction 100. A substrate 110 supports a first electrode 120 that is deposited on the substrate. A wetting layer 130 is deposited on the first electrode 120, and an oxide layer 132 is deposited on the wetting layer 130. The wetting layer 130 and the oxide layer 132 together form a tunnel junction barrier 134. A second electrode 140 is deposited on the tunnel junction barrier 134. The first electrode 120 is formed of a normal (i.e., non-superconducting) material, for example, gold (Au). The second electrode 140 is formed of a superconducting material, for example, aluminum (Al). In other words, the NIS junction 100 is formed by the three components: the first electrode 120, which is a normal conductive metal layer, the tunnel junction barrier 134, which separates the first electrode 120 from the second electrode 140, and the second electrode 140, which is a superconducting metal layer. The substrate 110 can include an oxide layer 112 on its upper surface, which is in contact with the first electrode 120.

When a voltage is applied across the first electrode 120 and the second electrode 130 using, for example, a voltage source 150, hot electrons in the normal metal first electrode 120 tunnel across the tunnel junction barrier 134, and cool the first electrode 120 while heating up the superconducting second electrode 140. The substrate 110, which is in thermal contact with the first electrode 120, is also cooled by the transfer of hot electrons across the tunnel junction barrier 134. In some embodiments, the first electrode 120 can be directly deposited on an element that is to be cooled, or the element can be placed in thermal contact with the NIS junction 100 via the substrate 110. The substrate 110, can for example, be a silicon substrate, having a silicon oxide layer 112 on its top surface, the silicon oxide layer being in contact with the first electrode 120.

Figure 1B:
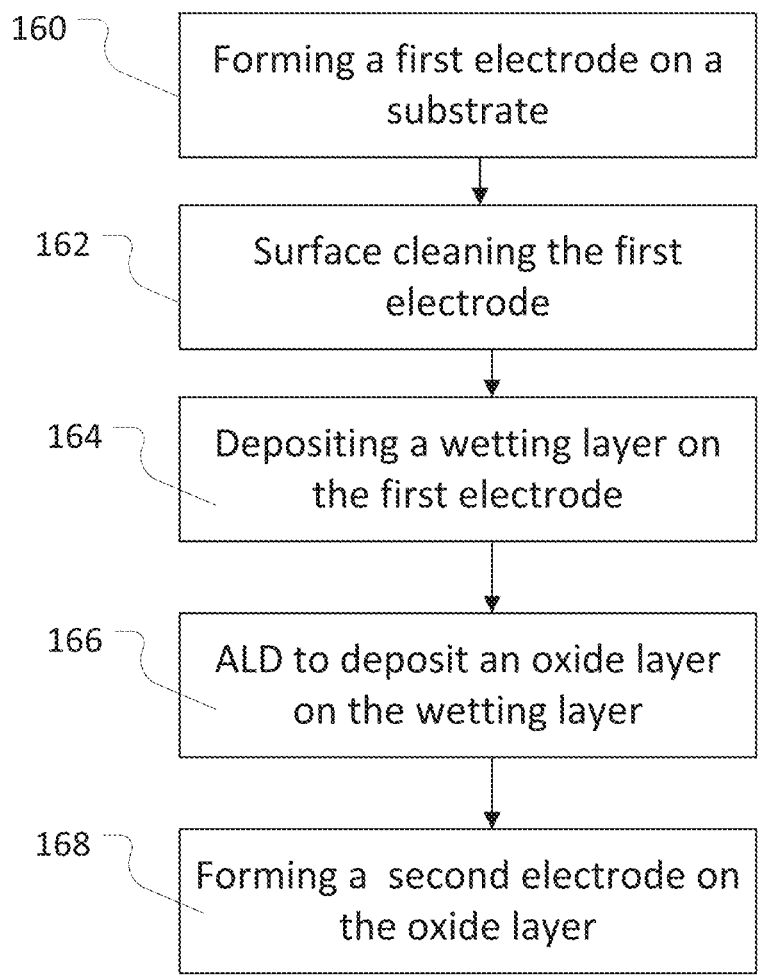
FIG. 1B shows a flowchart of an exemplary fabrication process for the tunnel junction.

FIG. 1B shows a flowchart of an exemplary junction fabrication process. In step 160, the first electrode 120 is formed on the substrate 110. An adhesive layer can be first deposited on the substrate 110 prior to the deposition of the first electrode. For example, a 10 nm adhesion layer of Ti can be applied using DC magnetron sputtering on the substrate 110. The substrate 110, can for example, be a Si wafer having 300 nm of $SiO_2$ coated on its top surface. The Si wafer can have a dimension, for example, of 2.25 $cm^2$. After the deposition of the Ti adhesion layer, a 50 nm Au film is deposited in situ using DC magnetron sputtering. The first electrode 120 is formed by patterning the Au film via a lift-off process. The Au film can be covered with, a layer of $SiO_2$ (for example, a 100 nm layer) via plasma-enhanced chemical vapor deposition (PECVD) at 250° C. The $SiO_2$ can be wet etched with a buffered oxide to open vias to the first electrode 120.

In step 162, the vias are surface cleaned with, for example, an Ar sputter etch. The Ar sputter etch can be performed for 5 minutes at 25 mTorr and 30 W RF bias.

Subsequently in step 164, an ultrathin wetting layer 130 of Al is deposited without breaking vacuum. The wetting layer 130 can, for example, be less than 2 nm, or approximately 1 nm of Al. In general, many other superconductors can be used. The most common ones found in most microfabrication facilities include Al and Nb.

In step 166, the substrate 110 bearing the first electrode 120 and the wetting layer 130 is then loaded into a device that performs atomic layer deposition (ALD) after a short exposure (e.g., one minute) to the atmosphere. ALD is a chemical vapor deposition process that sequentially deposits atomic monolayers through a series of self-limiting reactions. ALD has found widespread use in creating high permittivity coatings on the nanometer scale. More electric flux exists (per unit charge) in a high permittivity coatings because of polarization effects.

ALD is a promising alternative to thermal oxidation for providing an oxide layer that serves as the tunnel junction barrier in NIS junction 100. The sequential reactions used in the ALD process result in complete oxidation in the oxide layer 132, reducing defects in the barrier 134 and thus allowing larger area superconducting tunnel junctions to be fabricated.

The ALD device can be for example, a Beneq TFS200 commercial ALD machine, available from Beneq Oy Incorporated of Vantaa Finland. All ALD operations in the device are performed under a vacuum atmosphere. ALD of Al oxide ($Al_2O_3$) occurs by exposing a heated substrate to alternating pulses of trimethylaluminum (TMA) and $H_2O$ in vapor form, separated by a purge of nitrogen to ensure that the chemicals only react on a surface of the heated substrate and not in their gaseous states. Each full cycle typically deposits approximately 1 Å of $Al_2O_3$, giving sub-nanometer control of film thickness.

Direct deposition of ALD $Al_2O_3$ on the Au of the first electrode 120 without the step 164 is challenging because the ALD process typically requires hydroxyl bonding on the deposition surface and Au lacks surface hydroxyl groups. While specific growth parameters and hydrous plasmas may be used to deposit ALD on otherwise hydroxyl-free surfaces, the introduction of a metallic wetting layer, such as Al, that is readily oxidized by a similar process of hydroxylation is used in the fabrication process disclosed in this description.

The introduction of the wetting layer 130 in step 164 facilitates hydroxylation via attachment of hydroxyl groups to surface oxygen. For Al wetting layers thinner than the native oxide, the entire wetting layer oxidizes and contributes to a conformal tunnel barrier that is formed by the ALD $Al_2O_3$. An ideal conformal film on a surface has a thickness that is the same everywhere along the interface between the surface and the conformal film.

When the wetting layer 130 of the tunnel junction barrier 134 is not completely oxidized, portions of Al remain and electrons from these portions of Al may tunnel through the oxide layer 132 to the second electrode 140, contributing to residual superconducting-insulating-superconducting (SIS) tunneling. When the entire wetting layer 130 oxidizes, a true NIS junction is formed with no residual SIS tunneling.

In step 166, the device first performs a pre-clean of the wetting layer 130. The pre-clean can include a 10 cycle exposure of the wetting layer 130 to TMA. The pre-clean helps to limit the depth of the interfacial layer between the native Al oxide and $Al_2O_3$. Each cycle of the TMA pre-clean includes, for example, a 45 ms pulse of TMA, an 850 ms purge with nitrogen. After the 10 cycles of the TMA pre-clean, 18 cycles of $Al_2O_3$ deposition are performed. Both the TMA pre-clean and the deposition of $Al_2O_3$ can be performed at 250° C. Each $Al_2O_3$ cycle includes, for example, a 45 ms pulse of TMA, an 850 ms purge with nitrogen, a 50 ms pulse of $H_2O$, and another 850 ms purge of nitrogen.

After step 166, vacuum is broken and the substrate 110 bearing the first electrode 120 and the tunnel junction barrier 134 is loaded into the DC magnetron sputtering system to deposit the second electrode 140 in step 168. Prior to the deposition of the second electrode in the sputtering system, the substrate bearing the first electrode 120 and the tunnel junction barrier 134 can be heated in vacuum to 105° C. for 3 minutes to prevent any residual water vapor from clinging to a surface of the junction barrier. A layer of Al is then deposited. The layer of Al can, for example be a 0.8 µm layer of Al. The Al can be chemically etched to form the second electrode 140. As demonstrated in the NIS junction 100, high quality tunnel barriers, such as the tunnel junction barrier 134 can be deposited using ALD, on materials that do not natively oxidize, such as Au, or metals that form incomplete or conductive oxide layers, such as Cu, Ag, and Ti.

Historically, NIS junction refrigerators have used Al or Al alloys, such as AlMn, that are lightly doped with magnetic materials to suppress superconductivity but are still able to form a conformal native oxide tunnel barrier. The use of Au as a normal metal in the first electrode 120 has many benefits: Au remains resistive down to absolute zero and does not exhibit dilute alloy defects such as migration and uneven stoichiometry due to its pure composition. The finely tuned barrier thickness produced by ALD is not strictly limited by the penetration depth of native oxide growth. Although thermal oxide thickness can be increased through mechanisms such as heating, these often result in unwanted effects that limit device performance, such as the clumping and migration of the dilute elements within the alloys.

Using the steps 162-168 outlined in the flowchart shown in FIG. 1B, NIS junctions having a large-area (e.g., 2500 µm$^2$) were fabricated. The NIS tunnel junction can have lateral dimensions as large as 50 µm×50 µm. The NIS junction also has a high quality barrier deposited via ALD on Au together with an ultrathin (approximately 1 nm) wetting layer of Al. These steps enable demonstration of a deposited superconducting tunnel barrier.

Figure 2A:
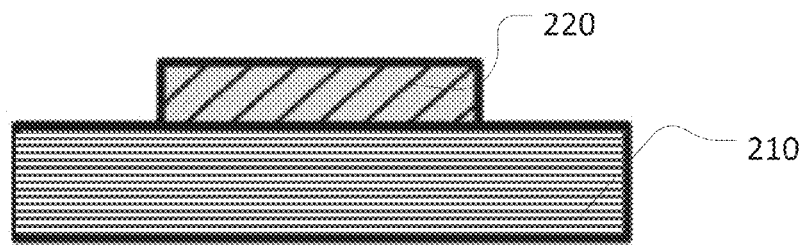
FIGS. 2A-2D show a schematic for the fabrication of a tunnel junction.
Figure 2B:
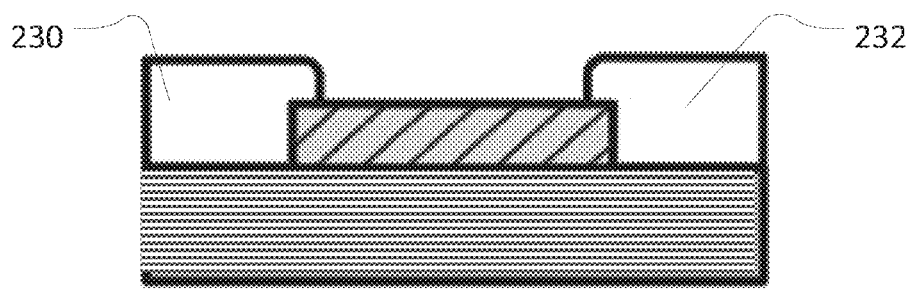

FIGS. 2A-2D show a fabrication process of a device 200 in which a NIS tunnel junction is formed on the same substrate as a SIS tunnel junction. In FIG. 2A, a first electrode 220 is deposited on a substrate 210. A Ti adhesion layer may be deposited between the first electrode 220 and the substrate 210. The substrate 210 can be a Si wafer having a coating of SiO$_2$ on its top surface. The first electrode 220 can be formed from, for example, an Au layer. The Au layer is then lift-off patterned to form the first electrode 220, in a similar fashion as first electrode 120, depicted in FIG. 1A. In FIG. 2B, a layer 230 of superconducting material is deposited on one end of the first electrode 220, and a layer 232 of superconducting material is deposited on another end of the first electrode 220. The layers 230 and 232 can be, for example, Al.

Figure 2C:
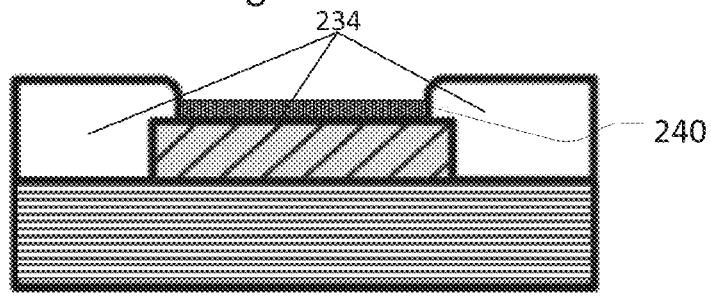

FIG. 2C shows an insulating tunnel junction barrier 240 formed from an ultrathin wetting layer of Al and Al$_2$O$_3$. Similar to the NIS junction 100 shown in FIG. 1A, the wetting layer of Al, can be deposited using DC magnetron sputtering while the Al$_2$O$_3$ layer is deposited via ALD. In practice, the tunnel junction barrier 240 covers the entire sample surface (i.e., over the layer 230, the first electrode 220 and the layer 232, but for illustration purposes, it is shown solely as the junction barrier over the first electrode 220. The layer 230 of superconducting material, the tunnel junction barrier 240 and the layer 232 of superconducting material forms a superconducting-insulating-superconducting (SIS) junction 234. In other words, the layer 230 and the layer 232 can be the first superconducting electrode and the second superconducting electrode of the SIS junction 234, respectively.

Figure 2D:
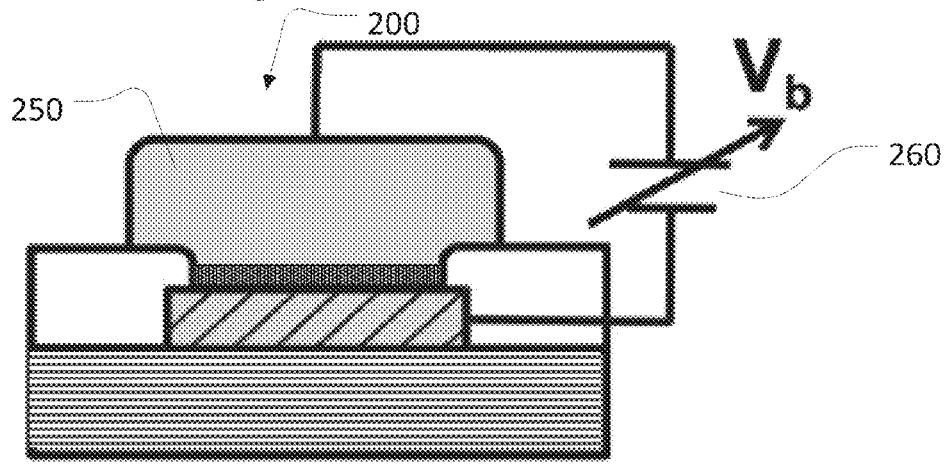

FIG. 2D shows a superconducting second electrode 250 being deposited and patterned to forming a NIS tunnel junction in the vertical direction, perpendicular to a top surface of the substrate 210. When a voltage source 260 applies a bias voltage V$_b$ across the first electrode 220 and the second electrode 250, hot electrons from the first electrode 220 are transferred across the tunnel junction barrier 240 into the second electrode 250. The device 200 also includes a SIS junction formed by the first layer 230, the tunnel junction barrier 240 and the second layer 232, in a horizontal direction parallel to the top surface of the substrate 210.

The SIS junction in device 200 can serve as flux qubit in quantum computing. In a flux qubit, the SIS junction parameters are engineered during fabrication so that a persistent current will flow continuously when an external flux is applied. An external flux can be provided from a simple source of current or it can be provided by a DC or AC magnetic field. The computational basis states of the qubit are defined by the circulating currents which can flow either clockwise or counter-clockwise. These currents screen the applied flux, limiting it to multiples of the flux quantum. When the applied flux through the loop area is close to a half integer number of flux quanta the two energy levels corresponding to the two directions of circulating current are brought close together and the loop may be operated as a qubit. As explained above, cooling occurs in the first electrode 220 when a biased voltage V$_b$ is applied across the first electrode 220 and the second electrode 250 of the NIS junction. As the SIS junction in device 200 share the same substrate 210 as the NIS junction, the device 200 can thus function as a NIS junction cooled qubit. Traditionally, qubits are cooled using dilution refrigerator. The NIS junction in device 200 is a compact and convenient way of fabricating a qubit that has integrated cooling capabilities.

Figure 2E:
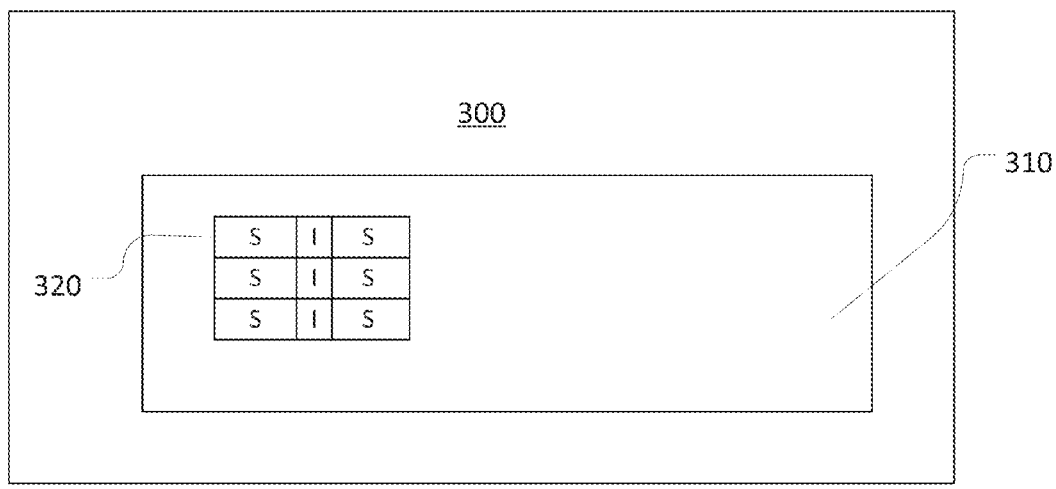
FIG. 2E shows a schematic of a quantum computer.

FIG. 2E shows a schematic of a quantum computer 300. Quantum computer 300 includes superconducting integrated circuit 310 that contains one or more flux qubits 312. Flux qubits 312 can be formed of a SIS junction, like junction 234 shown in FIG. 2C. Alternatively, each of the SIS junctions can be an integrated with a cooling NIS junction like the SIS junction in device 200.

Figure 3:
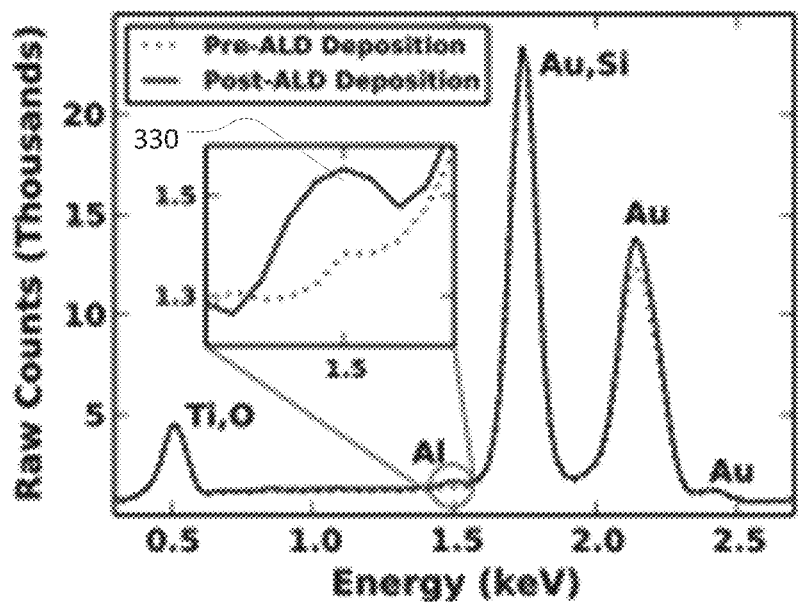
FIG. 3 shows energy dispersive X-ray spectra taken immediately before and after the $Al_2O_3$ barrier was deposited using ALD.

Energy-dispersive X-ray (EDX) spectroscopy was performed locally at the tunnel junction interface (i.e., surfaces of the layers 132 and 134 that are exposed to the internal atmosphere of the DC magnetron sputtering system and the ALD machine, respectively) during the barrier fabrication step (steps 164 and 166, as shown in FIG. 1B). FIG. 3 shows energy dispersive X-ray spectra taken immediately before and after the Al$_2$O$_3$ barrier was deposited using ALD in step 166. Elemental peaks are labeled in the main plot. The addition of an Al peak 330 between the pre- and post-spectra is easily observed and is the only elemental change to the spectra. The inset highlights the statistical significance of this change.

Before and after deposition of the Al wetting layer 130 in step 164, the Al peak is not readily identifiable in the corresponding spectra because the minute amount of Al provided by the wetting layer does not manifest in the scattering data. After the oxide layer 132 in the tunnel junction barrier 134 has been deposited, however, the Al peak 330 is easily observed, indicating that the Al$_2$O$_3$ deposition has adhered to the surface of the wetting layer 130. The change in the scattering data is shown in FIG. 3. No other new peaks appear in the spectrum post-ALD deposition, showing that the tunnel junction barrier 134 is formed by the Al$_2$O$_3$.

The film quality at the tunnel junction barrier was measured at each step in the barrier deposition process using phase sensitive interferometry (PSI) to quantify the roughness of the entire surface of the sample. Scanning electron microscopy (SEM) was used to quantify grain sizes on the deposited layers. The grain size of Au in the first electrode 120 was found to be invariant at approximately 30 nm. In contrast, the roughness of the Au surface varied across the surface of the first electrode 120 and was measured to have a root-mean-square (rms) roughness of 1.73 nm before treatment prior to the barrier deposition (step 162 in FIG. 1B). After the Ar sputter etch (in step 162), the rms surface roughness decreased to 1.54 nm, indicating that the sputter clean helped to improve surface uniformity.

The deposition of the Al wetting layer 130 was found to have no measurable effect on surface roughness. The rms value of the surface roughness of the wetting layer is 1.54 nm. Post the ALD of $Al_2O_3$ (step 166), the roughness increased to 1.73 nm. Since the Al is non-uniform in its coverage, ALD $Al_2O_3$ would be deposited more readily in some sites compared to others, leading to an overall increase in surface roughness. The increase in roughness with ALD $Al_2O_3$ is thus attributed to an uneven adherence to Au (that have not been covered by Al) and Al on the surface of the tunnel junction barrier 134.

High quality tunnel junction barriers should have a thickness that is greater than or equal to the roughness to avoid non-tunneling currents flowing through pinhole gaps. A pinhole gap is a conductive tunnel with a small diameter. That is, current flowing directly from the Au first electrode 120 to the Al second electrode 140, without passing through the tunnel junction barrier 134. For these samples, the value of 18 cycles (corresponding to approximately 1.8 nm) of $Al_2O_3$ was chosen such that the thickness of the barrier was the minimum required to exceed the roughness of the Au surface. Because barrier resistance is an exponential function of the thickness of the barrier layer, improvements in the fabrication process that decrease surface roughness would allow for much thinner and far less resistive barriers.

Figure 4A:
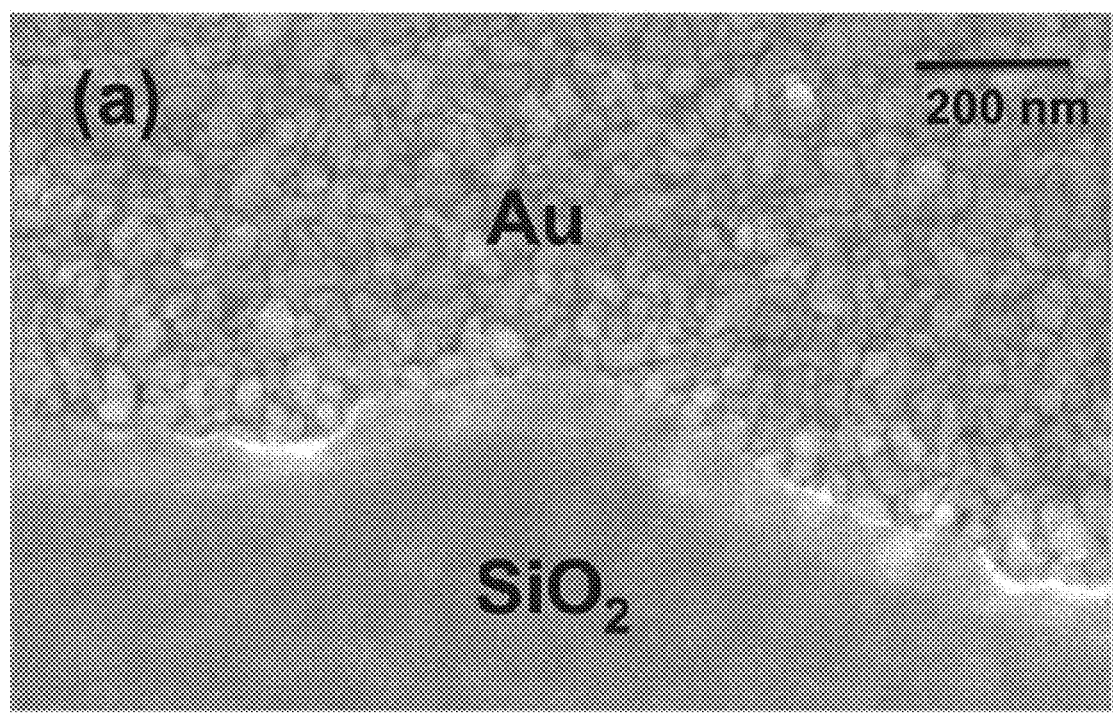
FIG. 4A shows a scanning electron microscopy (SEM) image of the surface roughness of a Au film before any surface treatment.
Figure 4B:
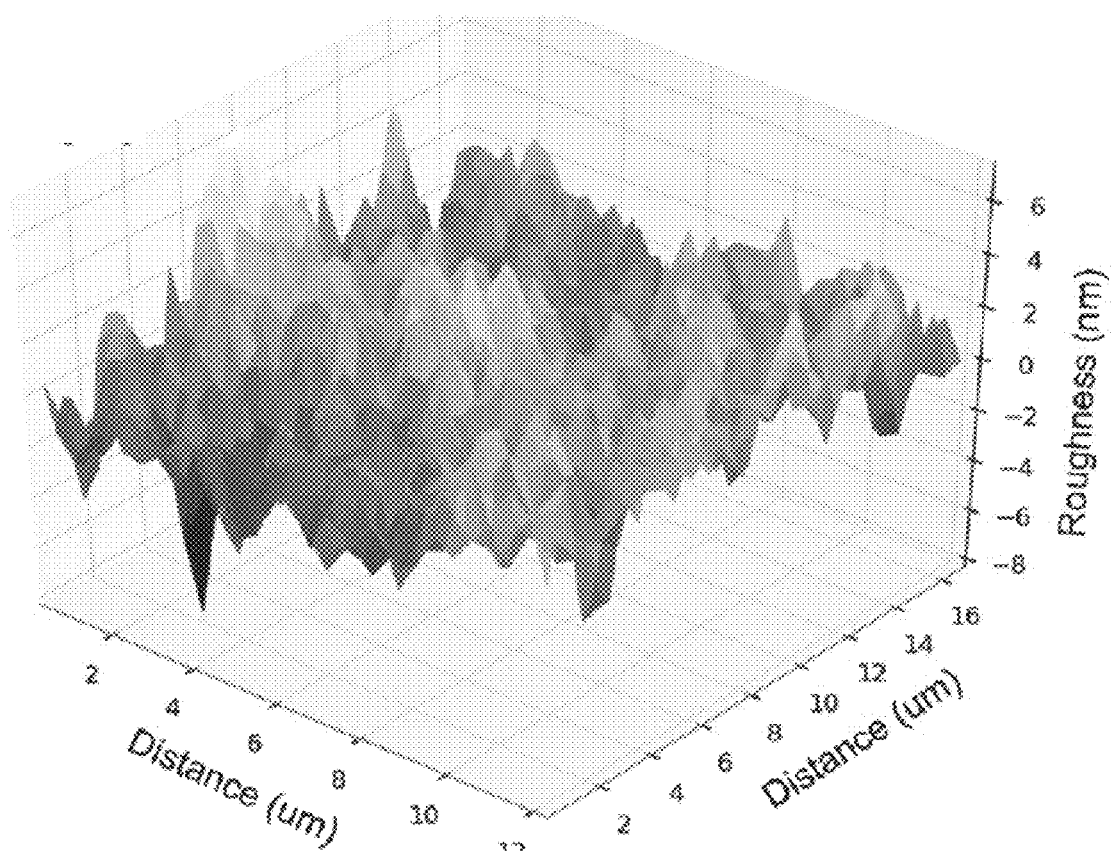
FIG. 4B shows a surface roughness plot obtained from measurements using phase sensitive interferometry of the Au film before any surface treatment.

FIG. 4A shows an SEM image of the surface roughness of the Au film before surface treatment using Ar sputter etch. FIG. 4B shows a surface roughness plot measured using phase sensitive interferometry of the Au film before surface treatment using Ar sputter etch. The SEM fits give an Au grain size of 30 nm and the PSI gives a rms roughness of 1.73 nm.

Cryogenic electronic transport measurements were used to characterize the tunneling properties of the NIS junctions having ALD deposited insulating tunnel junction barriers. Current-voltage (IV) curves were taken at a range of bath temperatures (i.e., the temperature the NIS junction 100 was exposed to) from 230 mK to 1100 mK. Control samples created with an identical process, but without the ALD step, exhibited sub-Ohm resistances and linear behavior at superconducting temperatures, confirming that ALD $Al_2O_3$ was useful for barrier formation.

Figure 5A:
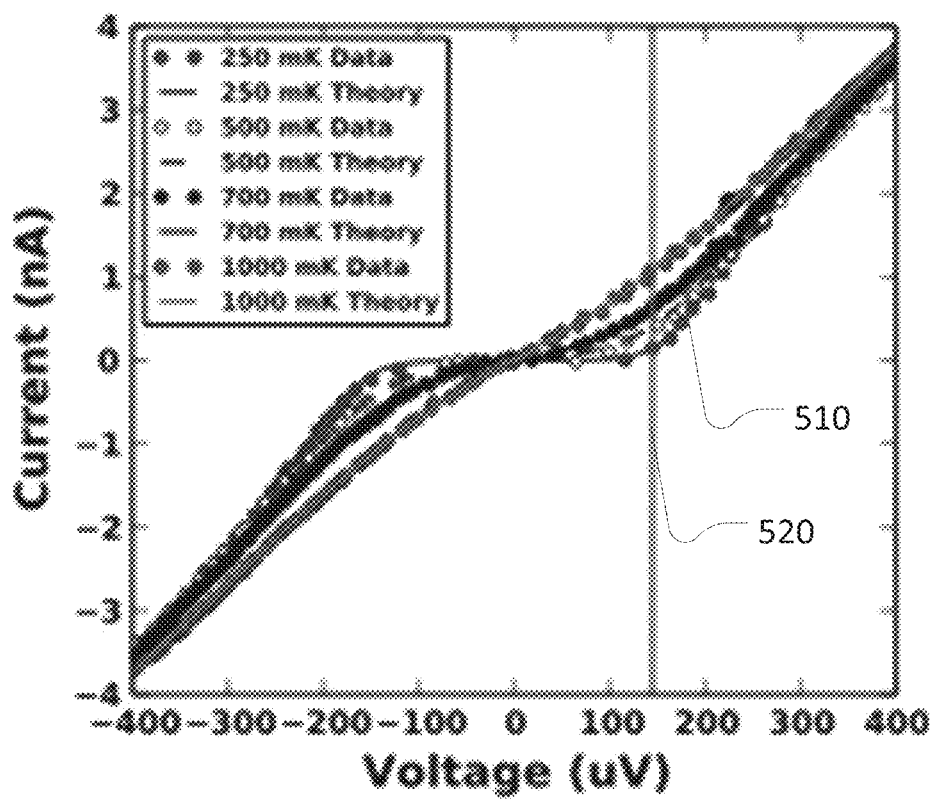
FIG. 5A shows NIS junction current-voltage (IV) curves as a function of temperature along with theoretical IV curves.

The measured IV curves are shown in FIG. 5A for four values of temperature, along with theoretical predictions for the curves based on the measured stage temperature. A stage temperature is the temperature measured by the Cernox thermometer. It is the temperature the junctions are cooled to make them operate in a specific portion of the superconducting transition. A curve 510 shows the theoretical curve calculated for the 250 mK measurement. A vertical line 520 at 145 µV illustrates a point in the bias voltage at which the IV curves exhibit maximally divergent behavior as a function of temperature. This is the most sensitive thermometry bias point.

For a superconducting tunnel junction, the predicted tunneling current I in response to a voltage bias, $V_b$, is given by $$I = \frac{1}{eR_N} \int_\Delta^\infty [f_N(E - eV_b) - f_N(E + eV_b)] N_S(E) \, dE \quad (1)$$

where e is the charge of the electron, $R_N$ is the normal-state resistance of the junction, $f_N(E)$ is the Fermi function evaluated at $T_N$, the temperature of the electron bath in the normal metal electrode. The function $N_S(E)$ is the superconducting density of states, given by $$N_S(E) = \frac{E}{\sqrt{E^2 - \Delta^2}} \quad (2)$$

where $\Delta$ is the superconducting band gap. The current-voltage curves yield a value of $\Delta=180$ µeV for Al at 230 mK and a normal state junction resistance of 105 kΩ. The agreement exhibited between the theoretical model and the measured data indicate that a high quality, conformal tunnel barrier is present. The junctions have a quality factor $$Q = \frac{R(V_b = 0)}{R_N} = 245$$

at 230 mK, which is the lowest base temperature achievable by the $^3$He sorption refrigerator used for junction barrier performance verification.

Tunneling in NIS junctions transfers the highest energy electrons from the normal metal to the superconductor, cooling the normal metal. Although normal metal cooling can be utilized for cryogenic applications, self-cooling of the electron bath in the normal metal limits the potential for thermometry. A self-cooled junction reaches its equilibrium temperature when the junction cooling power equals the external power loads. External power loads include, for example, normal metal resistance, radiation (heat) loading from a cryostat or wiring resistance Joule heating. The cooling power of a NIS junction is inversely proportional to its normal state resistance. As a result, NIS junctions fabricated with high resistance ALD barriers need not suffer from self-cooling and thus can reflect the true bath temperature, and serve as self-calibrated thermometers. The base temperature of operation of the self-calibrated thermometer can be solved using a thermal model as outlined below. A base temperature is the physical temperature junctions are at when used as thermometers.

When the normal state resistance and the superconducting band gap energy of the junction are known, the only free parameter in Equation 1, the electron bath temperature in the normal metal can be obtained by fitting. Current-voltage curves are not required for a suitable value of the bias where the curves in FIG. 5A diverge maximally as a function of temperature (145 µV). Only the resultant current needs to be fitted to obtain the temperature. This point is highlighted by the line 520 in FIG. 5A.

Figure 5B:
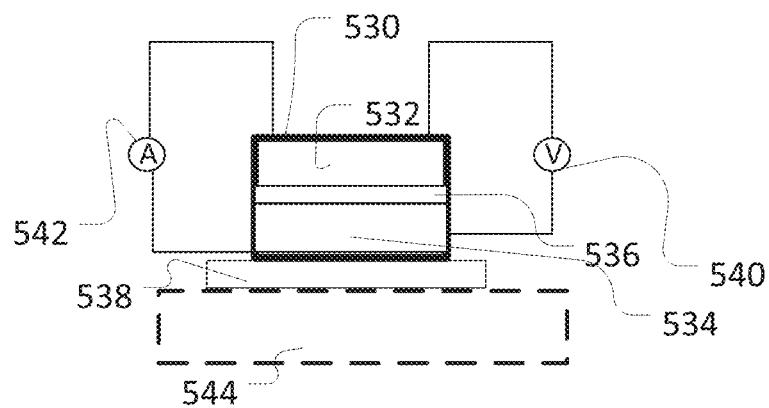
FIG. 5B shows a schematic of a cryogenic thermometer.

FIG. 5B shows a schematic of a cryogenic thermometer 530 that can be used to determine a temperature of an element 544. The cryogenic thermometer 530 includes a first normal metal electrode 534, and a second superconducting metal electrode 532 separated by a tunnel junction barrier 532. The cryogenic thermometer 530 is supported on a substrate 538. When a bias voltage (e.g., at a point providing maximally divergent temperature reading) is applied from the voltage source 540 across the first normal metal electrode 534 and the second superconducting metal electrode 532, a current flows from electrode 534 to electrode 532. This current is dependent on the temperature of the system. When the cryogenic thermometer 530 is in thermal contact with the element 544, the temperature of the element influences the current flowing from electrode 534 to electrode 532 and is measured by an ammeter 542. The current reading from the ammeter 542 is then fitted to obtain the temperature.

Figure 6:
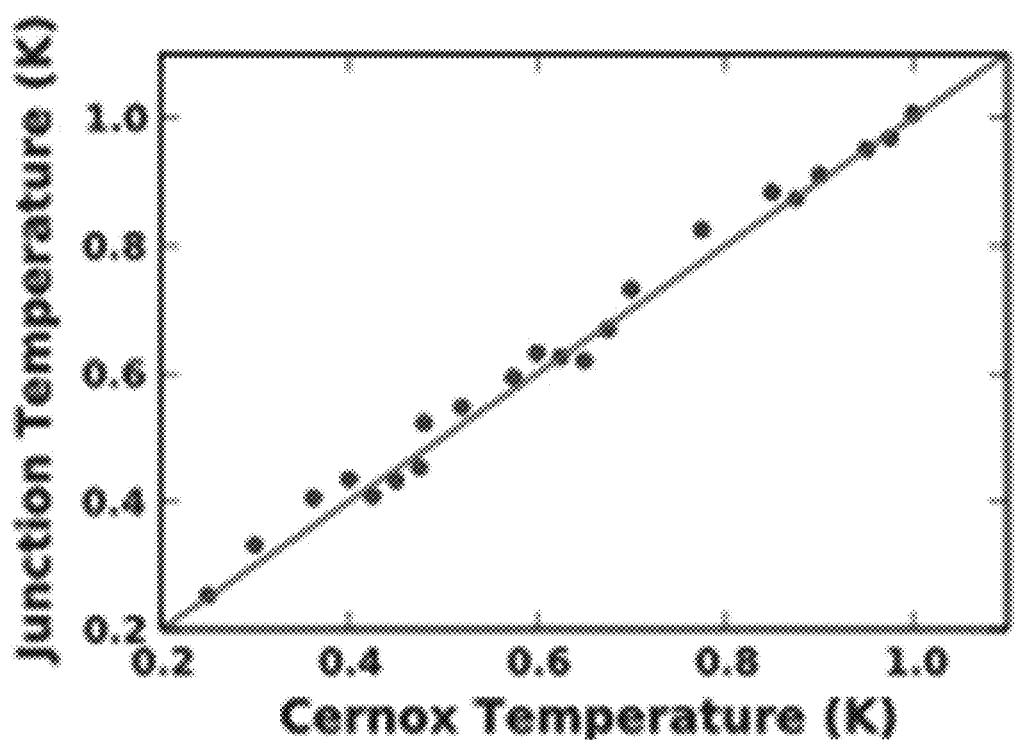
FIG. 6 shows best fit temperatures measured using the NIS junction versus temperatures measured using a calibrated cernox thermometer.

Using a bias value of 145 μV, the NIS junction electron bath temperature was calculated at a range of temperatures and a calibrated cernox thermometer was used for comparison. FIG. 6 shows the result of best fit temperatures for the NIS junction versus a calibrated cernox thermometer on a refrigerator head. The NIS junction data has a standard deviation of 23 mK from the cernox temperature, which may be due to temperature gradients in the cryostat in which the measurements were made and the uncertainties in differences in the positions of the cernox thermometer and the NIS junction.

As the tunnel junction barrier is deposited and not natively oxidized from the first electrode, the choice of material for the tunnel junction can be chosen almost without constraint, allowing NIS junction thermometers to be tuned for a range of operational temperatures. For instance, a superconducting Nb cathode and Au base (i.e. first) electrode form a self-calibrated thermometer usable in the temperature range of 0 to 9.2 K.

The net cooling power in the normal metal can be optimized by maximizing the junction cooling power and minimizing the external power loads caused by the normal metal resistance R. Decreasing surface roughness will allow for junctions with lower resistance and, as a result, an increased cooling power, P, which scales as $P \propto R_N^{-1}$. For example, large area junctions (2500 μm$^2$) with low resistance barriers (1 kΩ) would yield nanowatts of continuous cooling power, an order of magnitude improvement over current NIS refrigerators.

A normal metal resistance R gives an external power load of $P \propto I^2 R \propto R_N^{-2}$. Joule heating sets an upper limit on potential cooling power of the NIS junction. Since the Au used as the first electrode in the disclosed devices is much less resistive than the standard Al or Al alloys, the upper limit on the cooling power of these junctions is potentially much higher. Additionally, (other than substrate size) there is no upper limit on the lateral dimensions of junctions of the disclosed devices.

Room temperature resistance measurements confirmed that all of the 8 fabricated 2500 μm$^2$ junctions had formed complete tunnel barriers. The size of the junctions was chosen arbitrarily for demonstration purposes in this preliminary mask set. An increase in the size of the junction would decrease both $R_N$ and R. The fabrication process produces high yields of the junctions and allows for many junctions to be fabricated in series for increased cooling. The fabrication processes disclose here also allow for highly reliable and reproducible mass production of tunnel junctions.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Thus, particular embodiments of the invention have been described. Other embodiments are within the scope of the following claims. For example, the actions recited in the claims can be performed in a different order and still achieve desirable results.

What is claimed is:

1. A method for fabricating a superconducting quantum computer bit, the method comprising:
   depositing a first electrode on a substrate;
   depositing a first layer of a superconducting material on one end of the first electrode and on the substrate;
   depositing a second layer of the superconducting material on another end of the first electrode and on the substrate;
   depositing a wetting layer having a thickness of less than 2 nm on the first electrode, the wetting layer contacting both the first layer and the second layer of the superconducting material;
   using atomic layer deposition (ALD) to deposit an oxide layer on the wetting layer, the oxide layer contacting both the first layer and the second layer of the superconducting material; and
   depositing a second electrode on the oxide layer, the second electrode contacting both the first layer and the second layer of the superconducting material,
   wherein the superconducting quantum computer bit comprises a tunnel barrier formed by the wetting layer and the oxide layer,
   the first electrode comprises a non-superconducting material;
   the second electrode comprises a superconducting material, and
   a temperature of the superconducting quantum computer bit decreases when a voltage is applied across the first and second electrodes.

2. The method of claim 1, wherein the wetting layer comprises Al, and the wetting layer is oxidized during ALD of the oxide layer.

3. The method of claim 1, further comprising sputter etching the first electrode before the wetting layer is deposited onto the first electrode.

4. The method claim 1, wherein the first electrode comprises Au, and the tunnel junction is a normal-insulating-superconducting (NIS) tunnel junction.

5. The method of claim 1, wherein the tunnel barrier having an area of not less than 2500 μm$^2$ and a resistance of not more than kΩ.

6. The method of claim 1, wherein the oxide layer comprises Al$_2$O$_3$, and using ALD to deposit the oxide layer comprises subjecting the wetting layer to a plurality of deposition cycles, each of the deposition cycles comprising a pulse of trimethyl aluminum (TMA) and a pulse of H$_2$O.

7. The method of claim 6, wherein each of the deposition cycles deposit less than 2 Å of Al$_2$O$_3$.

8. A superconducting quantum computer bit, comprising:
a substrate having a surface;
a first electrode deposited on the surface of the substrate;
a wetting layer deposited on the first electrode, the wetting layer being less than 2 nm in thickness;
an oxide layer deposited on the wetting layer;
a second electrode deposited on the oxide layer;
wherein:
the first electrode is formed using a material selected from the group consisting of a non-oxidizing metal, a metal that forms an incomplete oxide, and a metal that forms a conductive oxide,
the quantum computer bit is configured to operate at a temperature where the second electrode is superconducting,
thermal transfer occurs between the first electrode and the second electrode when a voltage is applied across the first and second electrodes;
a first layer of a superconducting material deposited on the substrate and a first end of the first electrode; and
a second layer of the superconducting material deposited on the substrate and another end of the first electrode,
wherein:
the oxide layer is in contact with the first and second layers of the superconducting material, and a temperature of the superconducting quantum computer bit is reduced when a voltage is applied between the first electrode and the second electrode.

9. The superconducting quantum computer bit of claim 8, wherein the first electrode comprises Au.

10. The superconducting quantum computer bit of claim 8, wherein the wetting layer is oxidized.

11. The superconducting quantum computer bit of claim 8, wherein a point defect in the oxide layer is reduced compared to an oxide layer formed from thermal oxidation.

12. The superconducting quantum computer bit of claim 8, wherein the first electrode and the second electrode are free of alloys.

13. The superconducting quantum computer bit of claim 8, wherein the oxide layer has an area of not less than 2500 $\mu m^2$.

* * * * *